United States Patent [19]

Schmitt

[11] Patent Number: 4,795,980
[45] Date of Patent: Jan. 3, 1989

[54] DEVICE FOR MONITORING SHORT CIRCUITS AND OVERLOADS IN ELECTRONIC PROXIMITY SWITCHES

[75] Inventor: Manfred Schmitt, Amberg, Fed. Rep. of Germany

[73] Assignee: Siemens Aktiengesellschaft, Berlin and Munich, Fed. Rep. of Germany

[21] Appl. No.: 807,357

[22] Filed: Dec. 10, 1985

[30] Foreign Application Priority Data

Dec. 21, 1984 [DE] Fed. Rep. of Germany ....... 3446958

[51] Int. Cl.$^4$ ............................................. G01R 31/02
[52] U.S. Cl. ..................................... 324/423; 324/537; 361/93
[58] Field of Search ............ 324/424, 423, 522, 51-54, 324/418, 512, 537; 361/87, 93, 97

[56] References Cited

U.S. PATENT DOCUMENTS

| | | | |
|---|---|---|---|
| 3,656,026 | 4/1972 | Zocholl | 361/97 |
| 3,899,718 | 8/1975 | Schafe | 317/33 R |
| 3,924,178 | 12/1975 | Lockyer et al. | 324/418 |
| 4,148,087 | 4/1979 | Phadke | 324/522 X |
| 4,251,766 | 2/1981 | Souillard | 324/522 X |
| 4,315,295 | 2/1982 | Zocholl | 361/97 X |
| 4,321,647 | 3/1982 | Fordham | 361/97 |
| 4,414,601 | 11/1983 | Conroy, Jr. | 361/97 |
| 4,428,022 | 1/1984 | Engel et al. | 324/424 X |
| 4,434,476 | 3/1984 | Breen | 361/97 X |
| 4,442,472 | 4/1984 | Pang et al. | 361/97 X |
| 4,571,658 | 2/1986 | Ruta | 361/97 X |

FOREIGN PATENT DOCUMENTS

| | | |
|---|---|---|
| 2149063 | 4/1973 | Fed. Rep. of Germany . |
| 2306013 | 8/1974 | Fed. Rep. of Germany . |
| 2515654 | 10/1976 | Fed. Rep. of Germany . |
| 3111659 | 10/1982 | Fed. Rep. of Germany . |
| 714556 | 2/1980 | U.S.S.R. ................. 361/97 |

OTHER PUBLICATIONS

Schweitzer, "Digital Programmable Time-Parameter Relay Offers Versatility and Accuracy", *IEEE Trans. on Power Systems*, vol. PAS-99, No. 1, Jan./Feb., 1980, pp. 152-157.

Primary Examiner—Reinhard J. Eisenzopf
Assistant Examiner—Warren S. Edmonds
Attorney, Agent, or Firm—Kenyon & Kenyon

[57] ABSTRACT

A device for monitoring short circuits and overloads in electronic proximity switches of a transmission line. The device is a testing circuit which includes a current pickup which measures the current in the output circuit of a respective proximity switch which controls the output current flow by switching off or limiting the output current flow. The device also includes a circuit which provides a testing cycle for the current measurement with first and second delay times which control the output current during a short circuit or overload and a waiting time, substantially longer than the first delay time, between the start of two successive delay times. The length of the first delay time is chosen with respect to the time constant of the respective transmission line to be connected.

12 Claims, 3 Drawing Sheets

DEVICE FOR MONITORING SHORT CIRCUITS AND OVERLOADS IN ELECTRONIC PROXIMITY SWITCHES

TECHNICAL FIELD

The invention relates to a device for monitoring short circuits and overloads in a switching element in a transmission line. In particular, the device monitors short circuits and overloads in electronic proximity switches by measuring the current in the output circuits and controlling the flow of the current.

BACKGROUND OF THE INVENTION

Circuit arrangements for monitoring short circuits and overloads for a-c switches are previously known from German application DE-AS No. 21 49 063. In particular, the output of a three-conductor proximity switch can be switched off after a delay time whenever the maximum permissable load current is exceeded and switched on again after a waiting time which is substantially longer than the delay time. The testing cycle is repeated until the overload or the short circuit condition is corrected. However, for loads which are to be switched over long transmission lines by such proximity switches, the testing cycle can be initiated even for permissable load current values if too short a delay time is chosen. This is caused by the line capacity of each conductor which is proportional to the length of the transmission line and represents, in the first instant of time, a short circuit for the proximity switch since the line capacities must be charged by the output current. Yet, if the delay time were chosen accordingly lng and a true fault condition existed, a relatively large energy loss would occur during the testing cycle, which in most cases, leads to a thermal overload of the switching elements. In order to prevent this thermal overload, the cycle or waiting time could be increased, but this, in turn, would have an adverse effect on the speed of the fault detection.

SUMMARY OF THE INVENTION

The foregoing problem is obviated by the present invention which comprises means for measuring the current in the output circuit of the switching element and circuit means for providing a testing cycle for the current measurement with first and second delay times which control the output current flow during a short circuit or overload condition, the first delay time having a length chosen in consideration of the time constant of the transmission line to be connected and a waiting time, between the starts of two successive delay times, which is substantially longer than the delay time.

The different delay times can be generated simply by selecting the first delay time as an integral multiple of the second delay time. For generating the different delay times, it is advantageous to utilize a binary divider chain controlled by an oscillator. In order to assure a perfect correlation of the state of the individual components of the device with each other, it is advantageous to use means for providing a reset pulse when the supply voltage for the oscillator, the binary divider chain and the remainder of the circuit components is applied. Simple, commercially available components are sufficient if a monostable multivibrator is provided for connecting the current-measuring means to the output enable of the binary divider chain, and a plurality of bistable multivibrators, connected with the binary divider chain via a plurality of AND gates, are provided for controlling the output current in response to the delay times generated by the binary divider chain.

With the present invention, switching elements such as proximity switches with longer transmission lines can be realized without the need of overdesigning components to overcome the false tripping of a short circuit protection device caused by the line capacity of a longer transmission line.

BRIEF DESCRIPTION OF THE DRAWINGS

For a better understanding of the invention, reference is made to the following description of an exemplary embodiment thereof and to the accompanying drawings, wherein.

DETAILED DESCRIPTION

Figure 1:
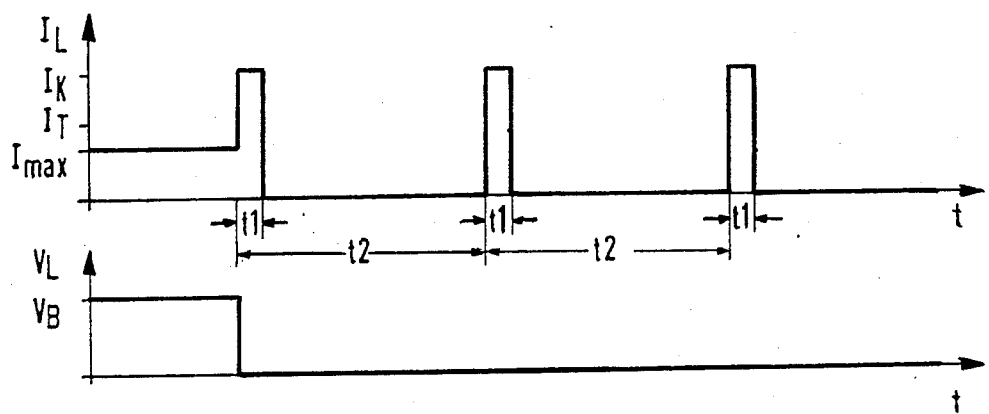
FIG. 1 shows timing diagrams of a load current and associated load voltage of a transmission line upon the occurence of a short circuit and the use of delay times of equal length by a monitoring device.

FIG. 1 shows a load current $I_L$ plotted versus time t and an associated load voltage $V_L$ plotted versus time t of a transmission line. As shown, the load current $I_L$, i.e., the output of a proximity switch, exceeds a permissable load current $I_{max}$ and reaches a short circuit load current $I_K$. The load current $I_L$, or the output of the proximity switch, is shut off after a delay time t1 in which the permissible load current $I_{max}$ remains exceeded. After a waiting time t2, which is substantially longer than the delay time t1, the load current $I_L$, or the output, is switched on again. In FIG. 1, the short circuit condition is shown to persist so the output is shut off again after another delay time t1. This is repeated until the overload or the short circuit condition is corrected. Note that the load voltage $V_L$ drops from an operating volta $V_B$ to zero so long as the fault condition exists.

Figure 2:
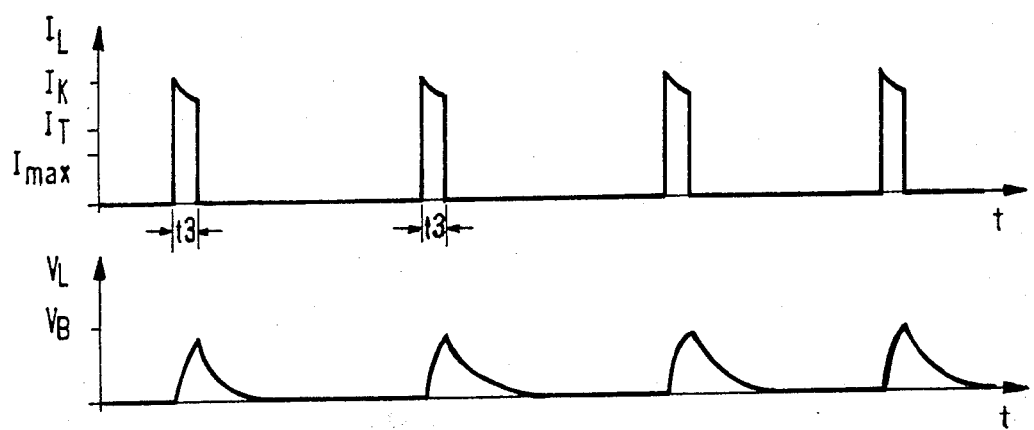
FIG. 2 shows timing diagrams of a load current and associated load voltage of a transmission line illustrating the effect of a capacitive load.

FIG. 2 shows a load current and voltage under the influence of a line capacity of a long transmission line which acts as a capacitive load. At the first instant of time, the line capacity acts as a short circuit for the proximity switch causing the load current $I_L$ to be at the short circuit load current $I_K$. If the charging process of the capacitive load is not complete up to the point when a delay time t3 begins, the load current $I_L$, which is at the short circuit load current $I_K$, has a falling tendency and the load voltage $V_L$ has an increasing tendency. The output is switched off after the delay time t3 although no overload or short circuit condition prevails (i.e., the load current $I_L$ drops below the short circuit load current $I_K$). Note, if the delay time t3 was chosen correspondingly long and a true short circuit condition existed, the output switching element (i.e., proximity switch) would have to carry during the delay time t3, in every testing cycle, an energy loss W which is equal to the value of $t3 \times V_B \times I_K$.

Figure 3:
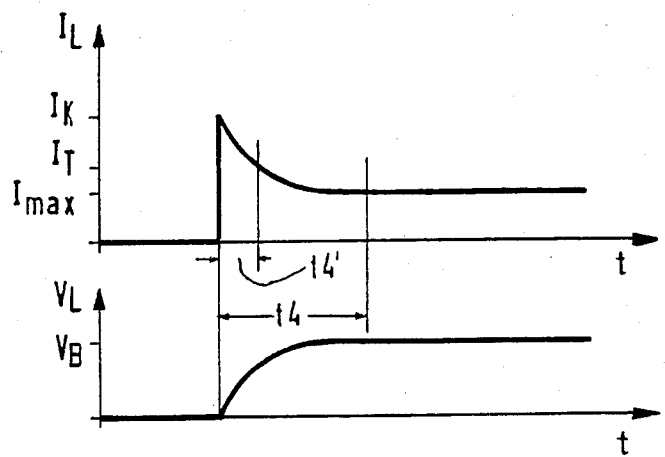
FIG. 3 shows the timing diagrams of FIG. 2 illustrating the minimum required delay time for a capacitive load.

As shown in FIG. 3, a first delay time t4 should be chosen to take the line capacities into consideration. Accordingly, the load current $I_L$ is made to drop below a load current $I_T$ at the onset of a clock pulse within a time period t4' which is less than the delay time t4. The load current $I_L$ then reaches the maximum permissible load current $I_{max}$ and the load voltage $V_L$ reaches the operating volta $V_B$ within the delay time t4. Thereby, no short circuit or overload condition is indicated since the load current $I_L$ is sufficiently reduced before the end of the delay time t4.

Figure 4:
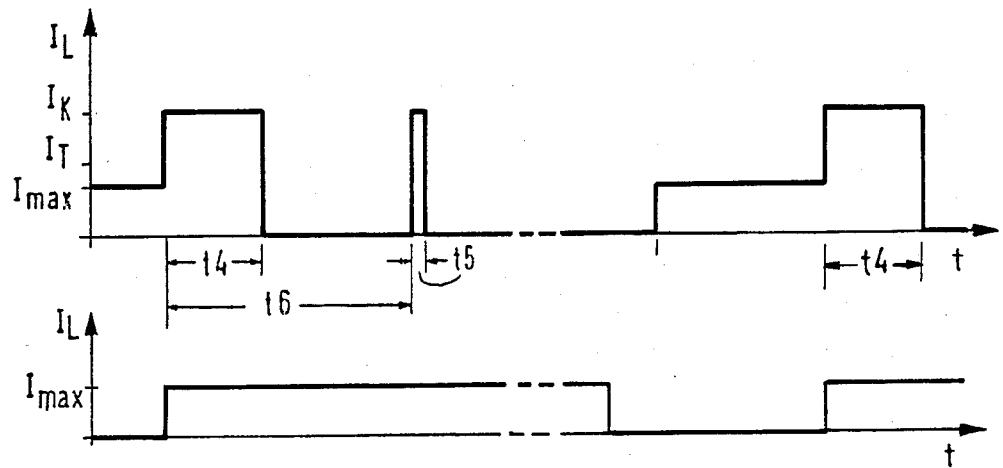
FIG. 4 shows timing diagrams of a load current of a transmission line if delay times of different lengths are used by a monitoring device.

FIG. 4 shows timing diagrams of a load current of a transmission line if delay times of different lengths are used by a monitoring device. If a short circuit occurs, the first testing cycle is traversed over the first delay time t4, for instance, 200 usec. A second delay time t5 (equal to the first time delay t4 divided by n, where n is a predetermined integral number) is switched after a waiting time t6. This second delay time t5 is utilized by the monitoring device until a short circuit no longer persists. Thereupon, the monitoring device is switched back to utilize the first time delay t4. Through this measure, it is possible to reduce the average power loss in the case of a true short circuit condition by a factor of 1/n and, thereby, largely eliminate the aforementioned problems without having to increase the testing cycle or waiting time t6 accordingly.

Figure 5:
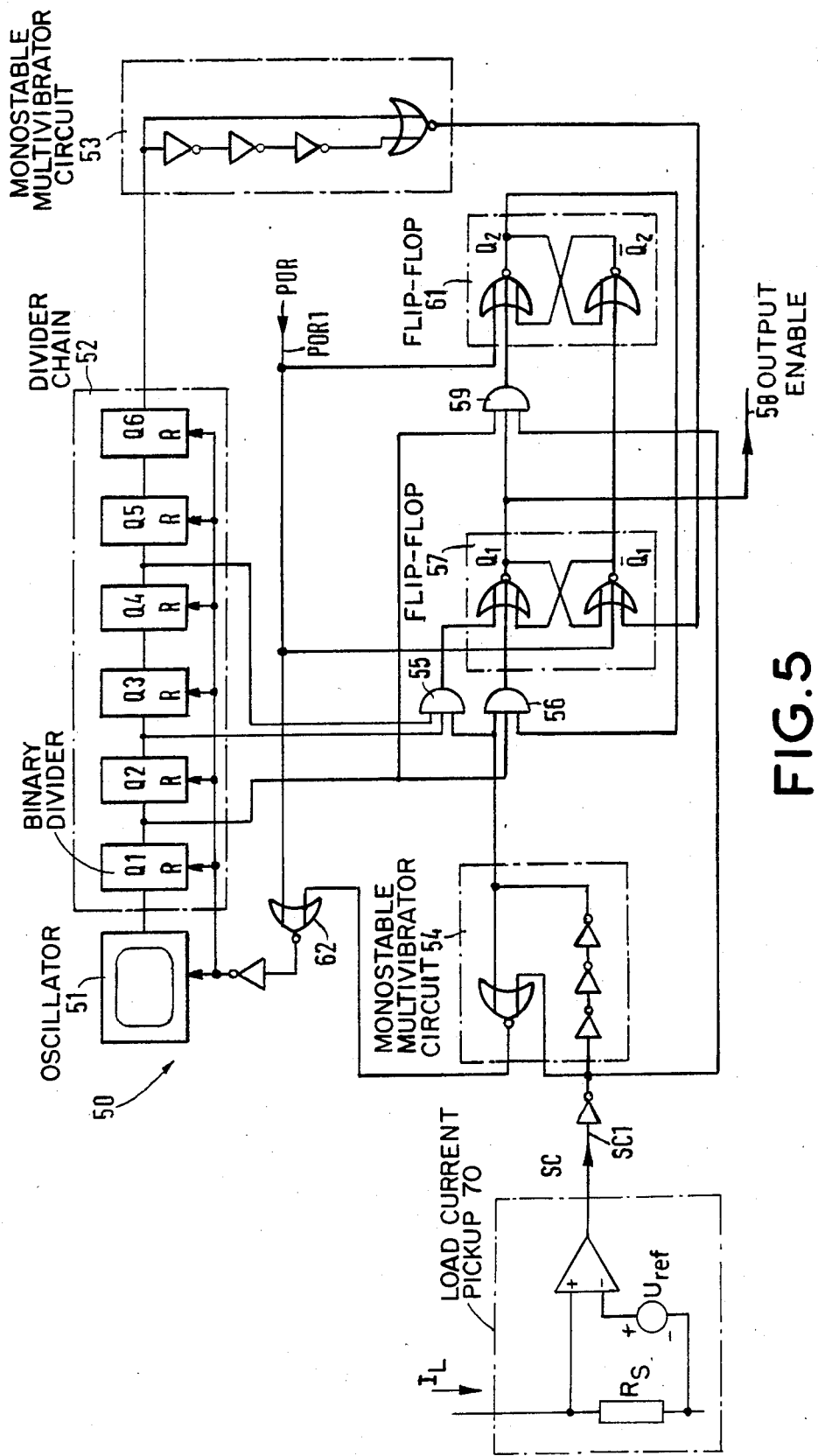
FIG. 5 shows a monitoring circuit of the present invention for obtaining delay times of different lengths as shown in FIG. 4.

FIG. 5 shows a circuit 50 of the present invention which generates delay times of different lengths as described above. Note, the conventional electronics of a proximity switch which is known per se is not shown in detail. The circuit 50 comprises an oscillator 51 which is connected to a divider chain 52. The divider chain 52 consists of six binary dividers Q1 ... Q6 connected seriatim. The last binary divider Q6 is connected to the input of a first monostable multivibrator circuit 53 (i.e., a one-shot).

A second monostable multivibrator circuit 54 introduces into the circuit 50, via a sensor input SC, the signal SC1 delivered by a load current pickup 70 (an exemplary pickup 70 comprising a comparator in combination with a voltage source $U_{ref}$ and a resistor $R_S$ is shown in FIG. 5). The inputs of a first AND gate 55 and a second AND gate 56 are connected to the second multivibrator 54 and to the binary outputs of the divider chain 52 (as shown, the first binary divider Q1 is tied to the second AND gate 56 and the second and fourth binary dividers Q2, Q4 are tied to the first AND gate 55). The outputs of the two AND gates 55, 56 and the output of the first multivibrator 53 feed into a first and a second input, respectively, of a first flip-flop 57 having two outputs . $Q_1$, $\overline{Q}_1$.

The first output $Q_1$ of the first flip flop 57 is connected to an output enable or release 58 for the proximity switch and, via a third AND gate 59, to a first input of a second flip-flop 61. The second output $\overline{Q}_1$ of the first flip-flop 57 is directly tied to a second input of the second flip-flop 61. A first output $Q_2$ of the second flip-flop 61 is fed back, via the second AND gate 56, to the first input of the first flip-flop 57. Note, the input of the third AND gate 59 is also tied to the binary output of the first binary divider Q1 and the sensor input SC.

A problem-oriented routine input POR resets the oscillator 51 and each binary divider of the divider chain 52 by sending a reset signal POR1 via a NOR gate 62 (to which the output of the second multivibrator 54 is also connected) as well as directly resetting the two flip-flops 57, 61 when the operating line voltage from the supply for the circuit 50 (not shown) is turned on.

In operation, the oscillator 51, the divider chain 52, and the two flip-flop stages 57, 61 are brought into a defined state when a reset signal POR1 is delivered by the problem-oriented routine input POR. If an overload or short circuit condition is detected at the sensor input SC (i.e., input level is high), the second monostable multivibrator 54 provides a pulse via the NOR gate 62, at which the reset signal POR1 is already present, to the oscillator 51 and the divider chain 52 whereby the latter are reset and synchronized. The first output $Q_2$ of the second flip-flop 61 carries a "low" signal. Consequently, the first flip-flop 57 can be reset by the signal SC1 of the sensor input SC only at the end of the first delay times t4 (see FIG. 4) which are determined by the outputs of the second and fourth binary dividers Q2, Q4 of the divider chain 52. As an additional consequence, the proximity switch output is blocked by a "low" signal at the output enable or release 58. At the same time, the second flip-flop 61 becomes set, i.e., the first output $Q_2$ is high.

After the waiting time t6, which is derived from the output of the last binary divider Q6 of the divider chain 52, the first monostable multivibrator 53 activates the first flip-flop 57 and releases the proximity switch output again. If an overload or short circuit condition is now detected again via the sensor input SC, the first flip-flop 57 can be reset via the second AND gate 56 after the second delay time t5 which is derived from the output of the first binary divider Q1 of the divider chain 52. This cycle of output free/output blocked, with the second delay time t5 and the waiting time t6, is repeated until the overload or short circuit condition is no longer detected (i.e., the sensor input SC is "low"). The input of the third AND gate 59 then carries a "high" signal and the second flip-flop 61 is reset after the second delay time t5. Thus, the starting state is established again.

It is to be understood that the embodiments describes herein are merely illustrative of the principles of the invention. Various modifications may be made thereto by persons skilled in the art without departing from the spirit and scope of the invention.

What is claimed is:

1. A device for monitoring short circuits and overloads in a switching element in a transmission line, comprising (a) means for measuring the current in the output circuit of the switching element (b) circuit means for providing a testing cycle for a current measurement carried out by said means for measuring the current with first and second delay times, the first delay time having a length chosen with respect to the time constant of the transmission line to be connected, and a time interval between the starting points of two successive delay times, which is substantially longer than the first delay time; and (c) means for controlling the current in the output circuit during a short circuit and an overload in response to the first and second delay times.

2. The device as set forth by claim 1, wherein the first delay time is chosen as an integral multiple of the second delay time.

3. The device as set forth by claim 1, wherein the circuit means for providing a testing cycle further comprises (a) a binary divider chain which generates the first and second delay times and (b) an oscillator which controls the binary divider chain.

4. The device as set forth by claim 2, wherein the circuit means for providing a testing cycle further comprises (a) a binary divider chain which generates the first and second delay times and (b) an oscillator which controls the binary divider chain.

5. The device as set forth by claim 1, wherein the circuit means for providing a testing cycle further comprises means for resetting the circuit means and the means for controlling when the operating line voltage is applied thereto.

6. The device as set forth by claim 2, wherein the circuit means for providing a testing cycle further comprises means for resetting the circuit means and the means for controlling when the operating line voltage is applied thereto.

7. The device as set forth by claim 3, wherein the circuit means for providing a testing cycle further comprises means for providing a reset signal to the binary divider chain, the oscillator and the means for controlling when the operating line voltage is applied.

8. The device as set forth by claim 4, wherein the circuit means for providing a testing cycle further comprises means for providing a reset signal to the binary divider chain, the oscillator and the means for controlling when the operating line voltage is applied.

9. The device as set forth by claim 3, wherein the circuit means for providing a testing cycle further comprises a first monostable multivibrator circuit for connecting the current measuring means to the oscillator and the means for controlling and a second monostable multivibrator circuit for connecting an output of the binary divider chain to the means for controlling.

10. The device as set forth by claim 8, wherein the circuit means for providing a testing cycle further comprises a first monostable multivibrator circuit for connecting the current measuring means to the oscillator and the means for controlling and a second monostable multivibrator circuit for connecting an output of the binary divider chain to the means for controlling.

11. The device as set forth by claim 3, wherein the means for controlling, comprises (a) a plurality of bistable multivibrator circuits for controlling the output current in response to the delay times generated by the binary divider chain and (b) a plurality of AND gates for connecting the bistable multivibrator circuits with the binary divider chain.

12. The device as set forth by claim 10, wherein the means for controlling, comprises (a) a plurality of bistable multivibrator circuits for controlling the output current in response to the delay times generated by the binary divider chain and (b) a plurality of AND gates for connecting the bistable multivibrator circuits with the binary divider chain.

* * * * *